(12) United States Patent
White et al.

(10) Patent No.: US 11,578,406 B2
(45) Date of Patent: Feb. 14, 2023

(54) AMPOULE FOR A SEMICONDUCTOR MANUFACTURING PRECURSOR

(71) Applicant: Applied Materials, Inc., Santa Clara, CA (US)

(72) Inventors: Carl White, Gilbert, AZ (US); Mohith Verghese, Phoenix, AZ (US); David Marquardt, Scottsdale, AZ (US); Jose Alexandro Romero, Scottsdale, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 35 days.

(21) Appl. No.: 17/114,798

(22) Filed: Dec. 8, 2020

(65) Prior Publication Data
US 2022/0178020 A1 Jun. 9, 2022

(51) Int. Cl.
*C23C 16/448* (2006.01)
*H01L 21/67* (2006.01)

(52) U.S. Cl.
CPC .... *C23C 16/4481* (2013.01); *H01L 21/67017* (2013.01)

(58) Field of Classification Search
CPC ...................... C23C 16/4481; H01L 21/67017
See application file for complete search history.

(56) References Cited

U.S. PATENT DOCUMENTS

| 7,122,085 B2 | 10/2006 | Shero et al. |
| 7,186,385 B2 | 3/2007 | Ganguli et al. |
| 7,429,361 B2 | 9/2008 | Ganguli et al. |
| 7,597,758 B2 | 10/2009 | Chen et al. |
| 7,678,194 B2 | 3/2010 | Ganguli et al. |
| 8,137,462 B2 | 3/2012 | Fondurulia et al. |
| 8,309,173 B2 | 11/2012 | Tuominen et al. |
| 8,986,456 B2 | 3/2015 | Fondurulia et al. |
| 9,004,462 B2 | 4/2015 | Gregg et al. |
| 9,469,898 B2 | 10/2016 | Gregg et al. |
| 9,593,416 B2 | 3/2017 | Fondurulia et al. |
| 10,392,700 B2 | 8/2019 | Baum et al. |
| 10,465,286 B2 | 11/2019 | Gregg et al. |
| 10,526,697 B2 | 1/2020 | Baum et al. |
| 2004/0016404 A1* | 1/2004 | Gregg ............... F17C 11/00 118/726 |
| 2005/0006799 A1* | 1/2005 | Gregg ............. C23C 16/4481 261/DIG. 65 |

(Continued)

FOREIGN PATENT DOCUMENTS

| KR | 20160124954 A | 10/2016 |
| WO | 2007044208 A2 | 4/2007 |

OTHER PUBLICATIONS

PCT International Search Report and Written Opinion in PCT/US2021/061718 dated Mar. 21, 2022, 11 pages.

*Primary Examiner* — Patrick C Williams
(74) *Attorney, Agent, or Firm* — Servilla Whitney LLC

(57) ABSTRACT

Ampoules for a semiconductor manufacturing precursors and methods of use are described. The ampoules include a container with an inlet port and an outlet port. The ampoules comprise an inlet plenum located between the inlet port and the cavity and an outlet plenum located between the outlet port and the cavity. A flow path is defined by a plurality of tubular walls and an ingress openings of the ampoule, through which a carrier gas flows in contact with the precursor.

19 Claims, 8 Drawing Sheets

(56) References Cited

U.S. PATENT DOCUMENTS

| | | |
|---|---|---|
| 2005/0066893 A1 | 3/2005 | Soininen |
| 2008/0099933 A1 | 5/2008 | Choi et al. |
| 2008/0149031 A1* | 6/2008 | Chu .................... C23C 16/4482 |
| | | 118/726 |
| 2008/0216743 A1 | 9/2008 | Chen et al. |
| 2010/0255198 A1* | 10/2010 | Cleary ................ C23C 16/4402 |
| | | 427/255.39 |
| 2018/0094351 A1 | 4/2018 | Verghese et al. |
| 2020/0056283 A1 | 2/2020 | Shero et al. |
| 2020/0340109 A1 | 10/2020 | Verghese et al. |

* cited by examiner

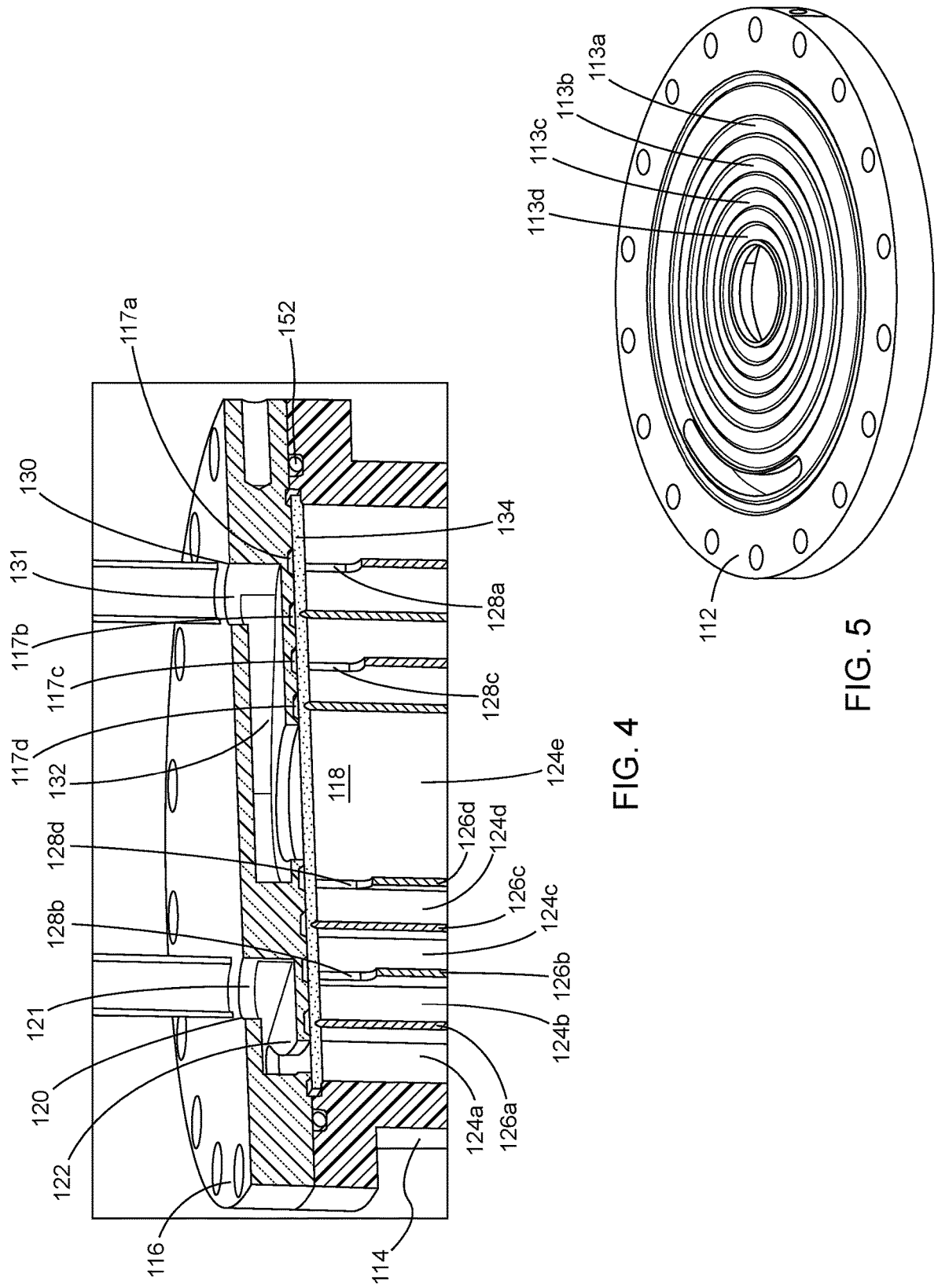

AMPOULE FOR A SEMICONDUCTOR MANUFACTURING PRECURSOR

TECHNICAL FIELD

The present disclosure relates generally to ampoules for and methods using semiconductor manufacturing precursors. In particular, the disclosure relates to ampoules and methods to provide a tortuous flow path for low vapor pressure precursors.

BACKGROUND

The semiconductor industry is using an increasing variety of chemistries for chemical vapor deposition (CVD) and atomic layer deposition (ALD) processes that come in liquid or solid form. The precursor is typically inside a closed vessel or ampoule with a single inlet and a single outlet.

Precursors with a low vapor pressure frequently use a carrier gas to carry the vapor out of the ampoule to the process reactor. For these types of processes there are two types of ampoules typically used: a bubbler where the inlet carrier gas goes into a tube that is submerged into the precursor; and a cross-flow ampoule where the carrier gas sweeps headspace in the ampoule. Often, there is only a very short flow path for the carrier gas. The short flow path from the inlet to the outlet of the vessel does not allow adequate residence time within the vessel to allow the carrier gas to become fully saturated with vaporized or sublimed precursor. Some existing ampoule designs do not evenly distribute the carrier gas across the entire surface of the precursor. Some existing ampoules designs do not provide adequate heating of the precursor within the entire vessel. Many other solid source ampoules do not provide a means for keeping precursor dust from traveling downstream where it hampers control valve performance or creates on-wafer particle issues.

There is a need in the art for ampoules and methods of making and use, where the ampoule, in particular a cross-flow ampoule, has an adequate flow path to saturate or nearly saturate the carrier gas with the precursor and provide consistent delivery of the precursor.

SUMMARY

One or more embodiments are directed to an ampoule for semiconductor manufacturing precursors. The ampoule comprises a container defining a cavity configured to hold the precursor. An inlet port and an outlet port are both in fluid communication with the cavity. The ampoule includes: an inlet plenum located between the inlet port and the cavity, and an outlet plenum located between the outlet port and the cavity. A plurality of elongate walls contain the precursor, and the walls are arranged to define flow channels. Each of the elongate walls comprises an ingress opening. A flow path is defined by the flow channels and the ingress openings, through which a carrier gas flows in contact with the precursor.

Additional embodiments of the disclosure are directed to an ampoule for dispensing a vapor mixture of a carrier gas and a low vapor pressure precursor used in semiconductor manufacturing. The ampoule comprises a container having a bottom wall, sidewalls, and a lid, the container defining a cavity configured to hold the precursor, such that a height (H) of the cavity spans from a lower surface of the lid to a top surface of the bottom wall. A single inlet port and a single outlet port are both in fluid communication with the cavity. The ampoule includes: an inlet plenum located between the inlet port and the cavity, and an outlet plenum located between the outlet port and the cavity. A plurality of elongate tubular walls containing the precursor arranged to define flow channels, each of the elongate walls comprising an ingress opening, the ingress openings being off-set such that not one ingress opening overlaps with another ingress opening. A tortuous flow path defined by the flow channels and the ingress openings, through which a carrier gas flows in contact with the precursor.

Further embodiments of the disclosure are directed to methods of providing a flow of precursor. The method comprises: flowing a carrier gas through an inlet port and an inlet plenum of an ampoule having a low vapor pressure precursor therein. The flow of carrier gas is directed within the ampoule and in contact with the precursor through a flow path defined by a plurality of elongate walls and ingress openings of each of the elongate walls, through which a carrier gas flows in contact with the precursor. The carrier gas and precursor flow out of the ampoule through an outlet plenum and an outlet port.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4 shows a perspective section of a portion of the ampoule and manifold of FIG. 2;

FIG. 5 shows a schematic view of a bottom wall of an ampoule of an embodiment;

Figure 1A:
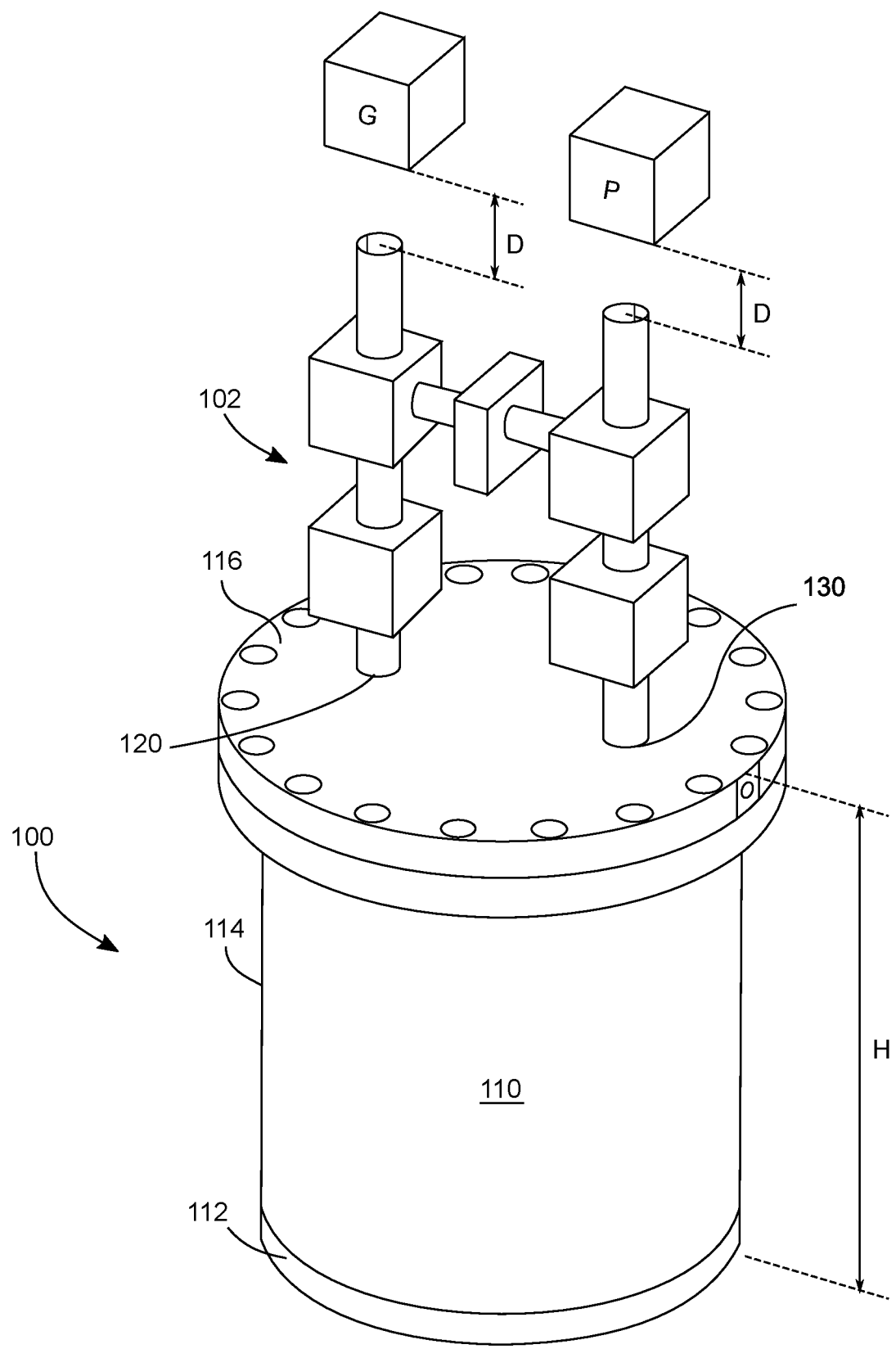
FIG. 1A shows a schematic view of an ampoule and accompanying manifold having an "outer-to-inner flow" configuration in accordance with an embodiment.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. The cross-hatch shading of the components in the figures are intended to aid in visualization of different parts and do not necessarily indicate different materials of construction.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

Some embodiments of the disclosure advantageously provide a long flow path for a carrier gas from ampoule inlet to outlet for the delivery of low vapor pressure precursors, e.g., liquid and/or solid source precursor. Low vapor pressure precursors are understood to refer to materials that do not readily vaporize under atmospheric conditions. Low vapor pressure precursors typically have a vapor pressure of less than 10 Torr, and more typically less than 1 Torr. In some applications, a carrier gas is used to deliver low vapor pressure material from an ampoule to a reactor. Low vapor pressure materials typically require heat to increase the vapor pressure. A non-limiting list of exemplary precursors includes $ZrCl_4$, $Y(EtCP)_3$, $HfCl_4$, $WCl_5$, $MoCl_5$, $In(CH_3)_3$, and liquid indium hafnium.

A flow path having a long distance allows the carrier gas adequate residence time to become partially to nearly to fully saturated with vaporized and/or sublimed and/or entrained precursor. Reference herein to "saturated" allows for varying degrees of saturation.

Embodiments herein also provide ways for heating low vapor pressure precursors in large volume ampoules, including ways to provide effective uniform heating of the precursors. Some specific embodiments advantageously retain low vapor pressure precursors, including solid precursor dust, within a cavity of the vessel, not allowing it to migrate upstream or downstream to control valves. Some embodiments advantageously control uneven depletion of the precursor. Some embodiments advantageously provide even distribution of the carrier gas along the entire surface of the precursor. Embodiments herein provide improved doses of the precursor. Designs provided herein may offer a high capacity (volume) ampoule in a smaller footprint than other designs. Designs herein are easy to clean and be refilled. Designs herein can accommodate precursor charges of up to 10-20 kilograms.

In some embodiments, the ampoules contain a plurality of elongate walls defining a labyrinth such that the flow path is tortuous. Advantageously, one or more embodiments provide a flow path whose distance can be five to ten times longer than distances found with common ampoules, in particular solid source sublimation vessels.

Ampoules comprise: a container defining a cavity configured to hold a precursor; an inlet port and an outlet port, both in fluid communication with the cavity; an inlet plenum and an outlet plenum, each located between the respective inlet or outlet port and the cavity; and a plurality of elongate walls containing the precursor arranged to define flow channels, each of the elongate walls comprising an ingress opening. A flow path is defined by the flow channels and the ingress openings, through which a carrier gas flows in contact with the precursor. In one or more embodiments, the flow path travels from an outermost channel to an innermost channel, which may be referred to as an "outer-to-inner flow" configuration. In one or more embodiments, the flow path travels from an innermost channel to an outermost channel, which may be referred to as an "inner-to-outer flow" configuration.

Generally, the flow paths provided herein force the carrier gas to flow around a series of elongate walls, which in one or more particular embodiments are nested concentric tubes, which define flow channels, each containing a volume of solid precursor. The gas flow changes direction from flow channel to flow channel until the last flow channel in communication with the outlet port is reached. This change of direction also enhances mixing of the vaporized and/or sublimed precursor with the carrier gas. Ingress openings allow the carrier gas to flow through into the next flow channel. Reference herein to gas flow includes the carrier gas alone or in combination with entrained and/or vaporized and/or sublimed precursor. The flow paths described herein, for example, with respect to FIG. 3 or FIG. 6, it is understood that a series of elongate walls, tubular or otherwise, with ingress openings configured to define flow channels therebetween will result in a desired flow path. Preferably, the ingress openings are off-set to ensure no flow channels are bypassed.

FIG. 1A shows a schematic view of an ampoule and accompanying manifold having an "outer-to-inner flow" configuration in accordance with an embodiment. An ampoule 100 and a manifold 102 are suitable for use with semiconductor manufacturing raw materials, which include reagents and precursors. The term "precursor" is used to describe the contents of the ampoule 100 and refers to any reagent that flows into a process environment.

The ampoule 100 includes a container 110 with a bottom wall 112, sidewalls 114, and a lid 116. An inlet port 120 and outlet port 130 are in fluid communication with a cavity defined by internal walls of the container 110. The inlet port 120 is generally configured to allow a connection to a gas source "G" by way of suitable piping and valve(s) and may have suitable threaded or sealing connections. In one or more embodiments, the gas source "G" is a carrier gas; in one or more embodiments, the carrier gas is inert. The outlet port 130 is also in fluid communication with the cavity. The outlet port 130 is generally configured to be able to connect to a line, including suitable piping and valve(s), to allow the flow of gases, which may include entrained particles, exiting the container 110 to flow to a processing chamber (or other component) "P". The outlet port 130 may have a welded or threaded connection to allow a gas line to be connected.

A height (H) of the cavity defined by the container 110 spans from a lower surface of the lid 116 to a top surface of the bottom wall 112.

Figure 2:
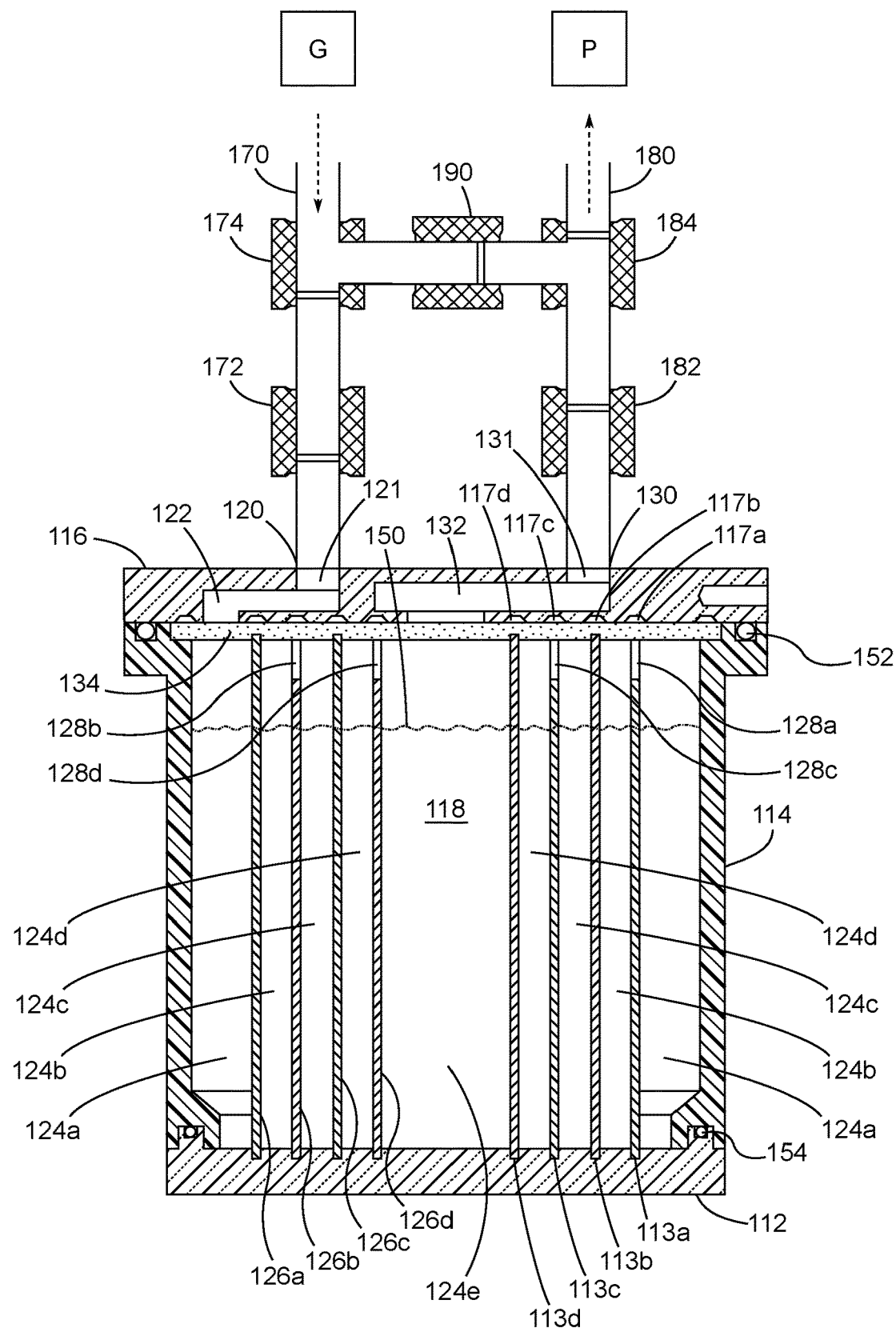
FIG. 2 shows a cross-section view of FIG. 1A according to one or more embodiments.

Turning to the embodiment of FIG. 2, which shows a cross-section view of FIG. 1A, the ampoule comprises a single inlet port 120 and a single outlet port 130. While the embodiment of FIG. 2 depicts one of each an inlet and an outlet port, should a particular application require, multiple inlet ports and outlet ports may be present. Positioning of the inlet and outlet ports may be switched to accommodate other designs.

FIG. 4 shows a perspective section of a portion of the ampoule and manifold of FIG. 2; and FIG. 5 shows a schematic view of a bottom wall of an ampoule of an embodiment.

With reference to FIGS. 2 and 4, the inlet port 120 has a passage 121 with an inner diameter defining a cross-sectional width of the passage 121 that extends into a portion of a depth of the lid 116. The passage 121 is in fluid communication with an inlet port plenum 122. The inlet port plenum 122 is designed to accommodate a volume of incoming carrier gas from a source "G", which in turn flows into the cavity—generally the cavity is shown as 118. The inlet port plenum 122 is sized so as to not restrict flow of incoming carrier gas. The inlet port plenum 122 may be positioned and or sized to accommodate incoming flow lines.

The outlet port 130 has a passage 131 with an inner diameter defining a cross-sectional width of the passage 131 that extends into a portion of a depth of the lid 116. The passage 131 is in fluid communication with an outlet port plenum 132. The outlet port plenum 132 is designed to accommodate a volume of outgoing entrained and/or saturated carrier gas, which in turn flows out of the ampoule to a downstream process chamber "P". The outlet port plenum 132 is sized so as to not restrict flow of outgoing entrained and/or saturated carrier gas. The outlet port plenum 132 may be positioned and or sized to accommodate outgoing flow lines.

With specific regard to this embodiment, the cavity 118 is made up of a plurality of flow channels 124a-124e defined by a plurality of elongate walls 126a-126d. The elongate walls 126a-126d each comprise an ingress opening as follows: ingress opening 128a of the wall 126a, ingress opening 128b of the wall 126b, ingress opening 128c of the wall 126c, and ingress opening 128d of the wall 126d. The ingress openings are off-set such that not one ingress opening overlaps with another ingress opening.

With reference to FIGS. 2 and 4-5, in this embodiment, the plurality of elongate walls 126a-126d at a bottom edge or rim reside in or mate with corresponding grooves 113a-113d in a top surface of the bottom wall 112. A plurality of grooves 117a-117d are optionally present in a lower surface of the lid 116. In one or more embodiments, in an absence of the distribution element 134, the plurality of elongate walls 126a-126d at the top edge or rim can reside in or mate with the corresponding grooves 117a-117d. The elongate walls 126a-126d span the height of the cavity extending into the bottom wall 116 and towards, and optionally into, the lid 112. The elongate walls are effective to conduct heat from one or more external sources.

A distribution element 134 is optionally present, sandwiched between the lid and top edges of the elongate walls. The distribution element 134 is located between the cavity 118 and both the inlet and outlet plenums, 122 and 132, respectively. That is, flow exiting the inlet plenum 122 passes through the distribution element 134 prior to entering the cavity 118, and flow exiting the cavity 118 passes through the distribution element 134 prior to entering the outlet plenum 132.

The distribution element may be any suitable material or configuration or dimensions or media grade offering one or more of the following characteristics: withstands long-term exposure to the precursor, does not introducing a pressure drop that would impede effective delivery of the precursor, pore size to inhibit and/or prevent fine particles and/or droplets of precursor from exiting the ampoule to protect both the inlet and outlet equipment, and pliable to be capable of making a slight seal between ends of the elongate walls and an inner diameter of the cavity. In one or more embodiments, the distribution element is a porous disk of filter media. In one or more embodiments, the distribution element is a sintered, porous stainless steel material. A non-limiting, exemplary porosity of the distribution element may be greater than or equal to 0.1 micrometers to less than 100 micrometers, and all values and subranges therebetween, as measured by average pore size.

Further, is optionally present is a shim between a lower surface of the distribution element and top edges of the elongate walls. The shim is discussed in more detail with respect to shim 236 of FIG. 6.

In some embodiments, the ampoule 100 includes a low vapor pressure material 150 within the cavity 118, residing in the flow channels defined by the elongate walls 126a-126d. Space above the material within the cavity 118 and below the lower surface of the lid is referred to as the head space of the ampoule 100. When present, the distribution element 134 resides in the head space of the ampoule. The material 150 can be a precursor for use with a semiconductor manufacturing process. In one or more embodiments, the material with a low vapor pressure is a solid.

In some embodiments, as shown in FIG. 2, the lid 116 is a separate component from the bottom wall 112 and sidewalls 114. The lid 116 can be connected to the sidewalls 114 of the container 110 using removable bolts through appropriately shaped openings, which may have a threaded portion to allow for easy connection of a threaded bolt. The bolts can be removed to allow the lid 116 to be removed from the container 110 so that the precursor 150 in the container 110 can be changed or added.

The lid may further comprise one or more external surface feature to reciprocate with an external heater. The bottom wall may be configured to reciprocate with an external heater. One or more jacket heaters may be provided around the sidewalls.

A first seal 152 is located between an upper surface of the sidewalls 114 and the lower surface of the lid 116 to form a fluid tight seal. A second seal 154 is located between an upper portion of the bottom wall 112 and a lower surface of the sidewalls 114 to form a fluid tight seal. In some embodiments, the first seal 152 and the second seal 154 are independently an O-ring.

In some embodiments (not shown), the lid 116 can be integrally formed with the sidewalls 114 and the bottom wall 112 of the container 110.

Different manifold configurations can be connected to the lid 116 to allow the ampoule 100 to be added to a process chamber. In some embodiments, an inlet line 170 is connected to the inlet port 120. An inlet valve 172 can be positioned on the inlet line 170 between gas source "G" and the inlet port 120. The inlet valve 172 can be integrally formed with the lid 116 or connected to the lid 116 as a separate component. An outlet line 180 can be connected to the outlet port 130. The outlet line 180 of some embodiments includes an outlet valve 182 located between the outlet port 130 and the processing chamber "P". The inlet valve 172 and outlet valve 182 can be used to isolate the ampoule 100 so that the contents of the cavity 118 are isolated from the environment outside of the container 110. In some embodiments, there are multiple valves along the inlet line 170 (e.g., 174) and/or the outlet line 180 (e.g., 184) and/or therebetween (e.g., 190). The valves can be manual valves or pneumatic valves.

Figure 3:
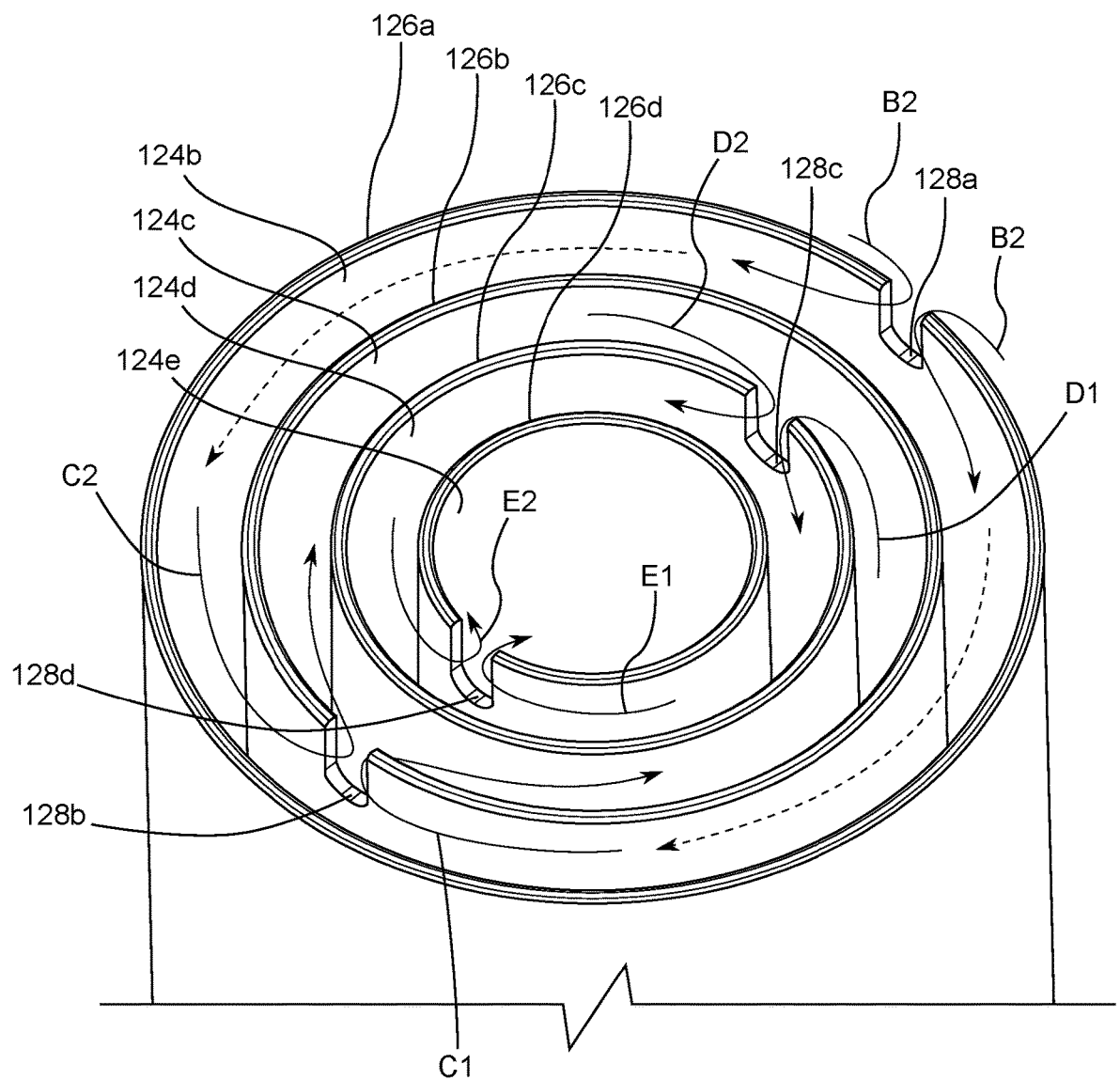
FIG. 3 shows a top perspective view of tubular walls of an ampoule according to FIGS. 1A and 2 with annotation of flow in accordance with one or more embodiments.

FIG. 3 shows a top perspective view of elongate walls 126a-126d of an ampoule with annotation of flow in accordance with one or more embodiments. In one or more embodiments, the elongate walls 126a-126d comprise elongate tubular walls, which define a series of flow channels 124a-124e. As depicted in FIG. 3, in one or more embodiments, the elongate walls 126a-126d are concentric and tubular. The relative location of the walls may be adjusted to, for example, favor depletion of the precursor in a desired matter. In one or more embodiments, annular distances between walls varies. The use of tubular elongate walls, fabricated by nesting readily available tubing facilitates assembly and reduces costs of the ampoules.

Carrier gas flow enters the ampoule 100 from the inlet port 120 by way of the inlet plenum 122, as discussed with respect to FIG. 2. The carrier gas enters the flow channel 124a defined by the sidewalls 114 (present in FIG. 4) and the elongate wall 126a and contacts the precursor 150 thereby entraining and/or vaporizing the precursor as the carrier gas passes over a surface of a volume of the precursor. Flow then proceeds through ingress opening 128a of elongate wall 126a, at which point the carrier gas enters flow channel 124b and the surface of elongate wall 126b opposite the ingress opening 128a directs the flow in two directions, depicted by arrows B1 and B2 through the flow channel 124b. While in flow channel 124b, the carrier gas continues to contact the precursor 150 and become saturated. Similarly, flow then proceeds through ingress opening 128b of elongate wall 126b, at which point the carrier gas enters flow channel 124c and the surface of elongate wall 126c directs the flow in two directions, depicted by arrows C1 and C2 through the flow channel 124c. While in flow channel 124c, the carrier gas continues to contact the precursor 150 and become saturated. Likewise, flow then proceeds through ingress opening 128c of elongate wall 126c, at which point the carrier gas enters flow channel 124d and the surface of elongate wall 126d directs the flow in two directions, depicted by arrows D1 and D2 through the flow channel 124d. While in flow channel 124d, the carrier gas continues to contact the precursor 150 and become saturated. Finally, flow then proceeds through ingress opening 128d of elongate wall 126d, at which point the carrier gas enters flow channel 124e, depicted by arrows E1 and E2 and out of the ampoule through outlet plenum 132 and outlet port 130. While in flow channel 124e, the carrier gas continues to contact the precursor 150 and become saturated.

Accordingly, the flow channels 124a-124e are nested comprising a plurality of tortuous passages (124a, 124b, 124c, 124d) and an outlet passage (124e), such that with respect to the tortuous passages, flow through a first ingress opening (128a, 128b, 128c) diverts the carrier gas into first and second portions each flowing in first and second directions (e.g., B1 and B2, C1 and C2, and D1 and D2) through first and section sections of the tortuous passages, respectively.

Figure 1B:
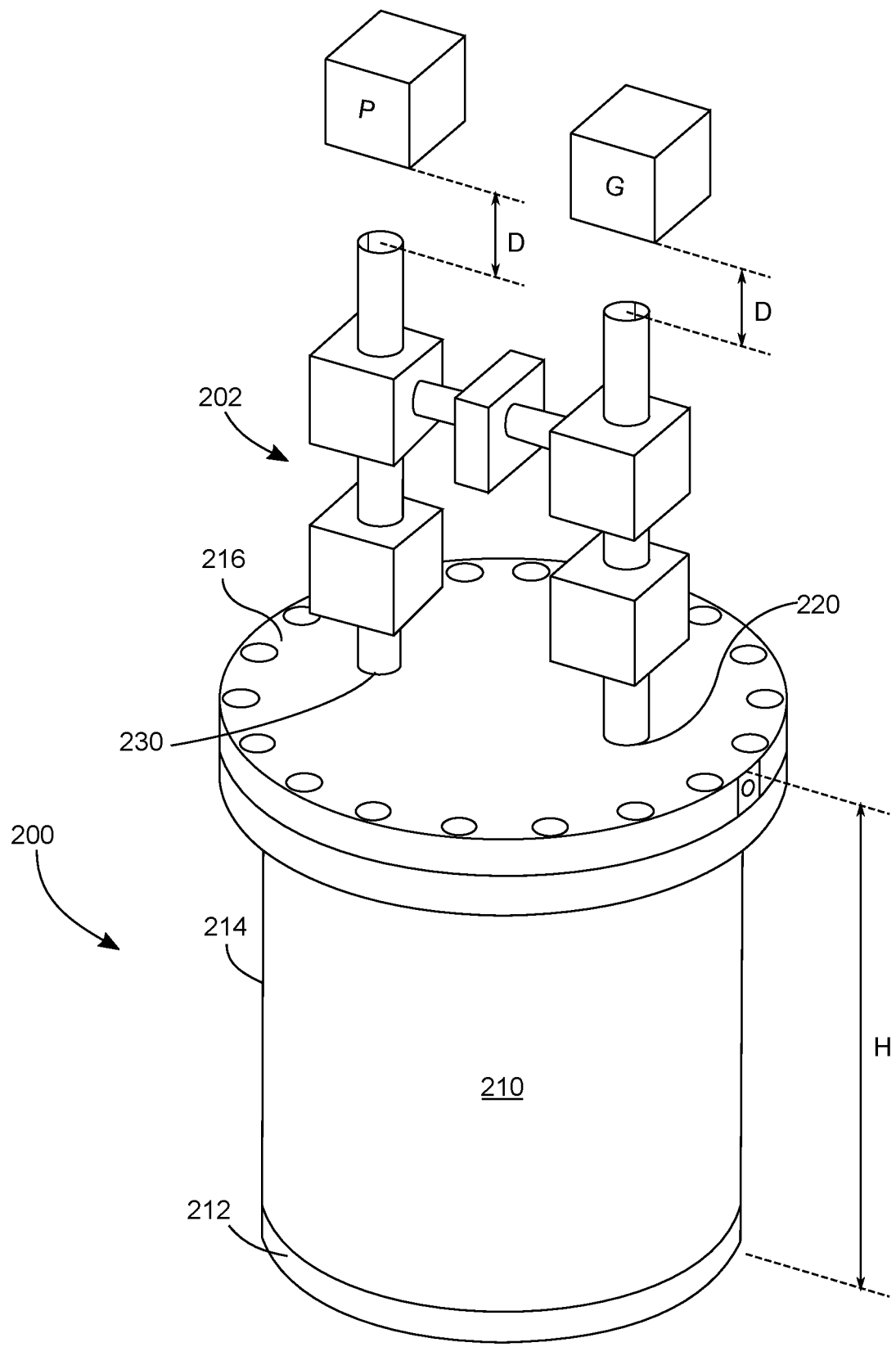
FIG. 1B shows a schematic view of an ampoule and accompanying manifold having an "inner-to-outer flow" configuration in accordance with another embodiment.

FIG. 1B shows a schematic view of an ampoule and accompanying manifold having an "inner-to-outer flow" configuration in accordance with an embodiment. An ampoule 200 and a manifold 202 are suitable for use with semiconductor manufacturing raw materials, which include reagents and precursors. The term "precursor" is used to describe the contents of the ampoule 200 and refers to any reagent that flows into a process environment.

The ampoule 200 includes a container 210 with a bottom wall 212, sidewalls 214, and a lid 216. An inlet port 220 and outlet port 230 are in fluid communication with a cavity defined by internal walls of the container 210. The inlet port 220 is generally configured to allow a connection to a gas source "G" by way of suitable piping and valve(s) and may have suitable threaded or sealing connections. In one or more embodiments, the gas source "G" is a carrier gas; in one or more embodiments, the carrier gas is inert. The outlet port 230 is also in fluid communication with the cavity. The outlet port 230 is generally configured to be able to connect to a line, including suitable piping and valve(s), to allow the flow of gases, which may include entrained particles, exiting the container 210 to flow to a processing chamber (or other component) "P". The outlet port 230 may have a welded or threaded connection to allow a gas line to be connected.

A height (H) of the cavity defined by the container 210 spans from a lower surface of the lid 216 to a top surface of the bottom wall 212.

Figure 6:
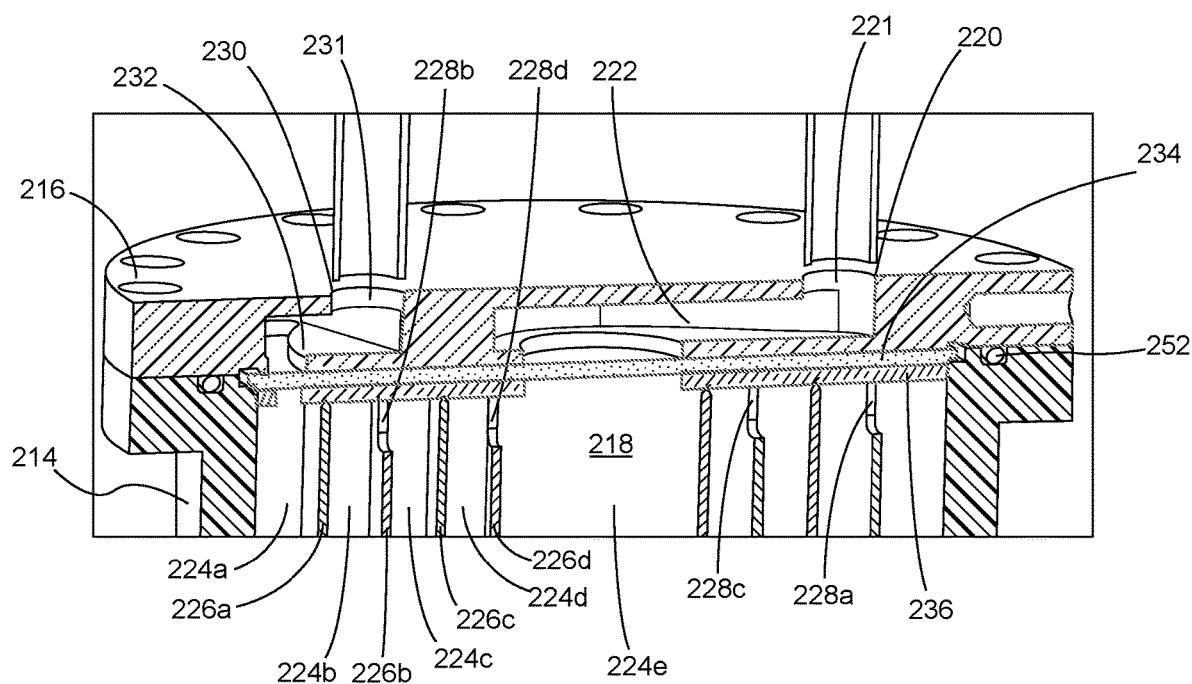
FIG. 6 shows a perspective section of a portion of an ampoule and manifold of FIG. 1B according to one or more embodiments.

Turning to the embodiment of FIG. 6, which shows perspective section of a portion of the ampoule and manifold of FIG. 1B, the ampoule comprises a single inlet port 220 and a single outlet port 230. While the embodiment of FIG. 6 depicts one of each an inlet and an outlet port, should a particular application require, multiple inlet ports and outlet ports may be present. Positioning of the inlet and outlet ports may be switched to accommodate other designs.

With reference to FIG. 6, the inlet port 220 has a passage 221 with an inner diameter defining a cross-sectional width of the passage 221 that extends into a portion of a depth of the lid 116. The passage 121 is in fluid communication with an inlet port plenum 222. The inlet port plenum 222 is designed to accommodate a volume of incoming carrier gas from a source "G", which in turn flows into the cavity— generally the cavity is shown as 218. The inlet port plenum 222 is sized so as to not restrict flow of incoming carrier gas. The inlet port plenum 222 may be positioned and or sized to accommodate incoming flow lines.

The outlet port 230 has a passage 231 with an inner diameter defining a cross-sectional width of the passage 231 that extends into a portion of a depth of the lid 216. The passage 231 is in fluid communication with an outlet port plenum 232. The outlet port plenum 232 is designed to accommodate a volume of outgoing entrained and/or saturated carrier gas, which in turn flows out of the ampoule to a downstream process chamber "P". The outlet port plenum 232 is sized so as to not restrict flow of outgoing entrained and/or saturated carrier gas. The outlet port plenum 232 may be positioned and or sized to accommodate outgoing flow lines.

With specific regard to this embodiment, the cavity 218 is made up of a plurality of flow channels 224a-224e defined by a plurality of elongate walls 226a-226d. The elongate walls 226a-226d each comprise an ingress opening as follows: ingress opening 228a of the wall 226a, ingress opening 228b of the wall 226b, ingress opening 228c of the wall 226c, and ingress opening 228d of the wall 226d. The ingress openings are off-set such that not one ingress opening overlaps with another ingress opening.

In one or more embodiments, the plurality of elongate walls 226a-226d at a bottom edge or rim may reside in or mate with corresponding grooves (not shown in FIG. 6 but analogous to 113a-113d) in a top surface of the bottom wall 212. In this embodiment, there are no grooves in a lower surface of the lid 216. The elongate walls 226a-226d span the height of the cavity extending into the bottom wall 216 and towards the lid 212. The elongate walls are effective to conduct heat from one or more external sources.

A distribution element 234, as characterized with respect to the distribution element 134 of FIGS. 2 and 4, is optionally present, sandwiched between the lid and top edges of the elongate walls. The distribution element 234 is located between the cavity 218 and both the inlet and outlet plenums, 222 and 232, respectively. That is, flow exiting the inlet plenum 222 passes through the distribution element 234 prior to entering the cavity 218, and flow exiting the cavity 218 passes through the distribution element 234 prior to entering the outlet plenum 232.

In the embodiment of FIG. 6, a shim 236 is located between a lower surface of the distribution element and top edges of the elongate walls. The shim has openings that correspond to flow channels 224a and 224e in order to avoid restricting flow. The shim is a soft and compliant material, for example, a soft metal such as aluminum, or a pliable polymeric or elastomer material. The shim provides support to the distribution element 234.

In some embodiments, the ampoule 200 includes a low vapor pressure material within the cavity 218, residing in the flow channels defined by the elongate walls 226a-226d. Space above the material within the cavity 218 and below the lower surface of the lid is referred to as the head space of the ampoule 200. When present, the distribution element 234 resides in the head space of the ampoule. The material can be a precursor for use with a semiconductor manufacturing process. In one or more embodiments, the material with a low vapor pressure is a solid.

In some embodiments, as shown in FIG. 6, the lid 216 is a separate component from the bottom wall (e.g., 212 of FIG. 1A) and sidewalls 214. The lid 216 can be connected to the sidewalls 214 of the container using removable bolts through appropriately shaped openings, which may have a threaded portion to allow for easy connection of a threaded bolt. The bolts can be removed to allow the lid 216 to be removed from the container so that the precursor in the container can be changed or added.

The lid may further comprise one or more external surface feature to reciprocate with an external heater. The bottom wall may be configured to reciprocate with an external heater. One or more jacket heaters may be provided around the sidewalls.

A first seal 252 is located between an upper surface of the sidewalls 214 and the lower surface of the lid 216 to form a fluid tight seal. A second seal is located between an upper portion of the bottom wall and a lower surface of the sidewalls to form a fluid tight seal. In some embodiments, the first seal 252 and the second seal are independently an O-ring.

In some embodiments (not shown), the lid 216 can be integrally formed with the sidewalls 214 and the bottom wall of the container.

Different manifold configurations can be connected to the lid 216 to allow the ampoule 200 to be added to a process chamber as discussed with respect to FIG. 2.

Figure 7:
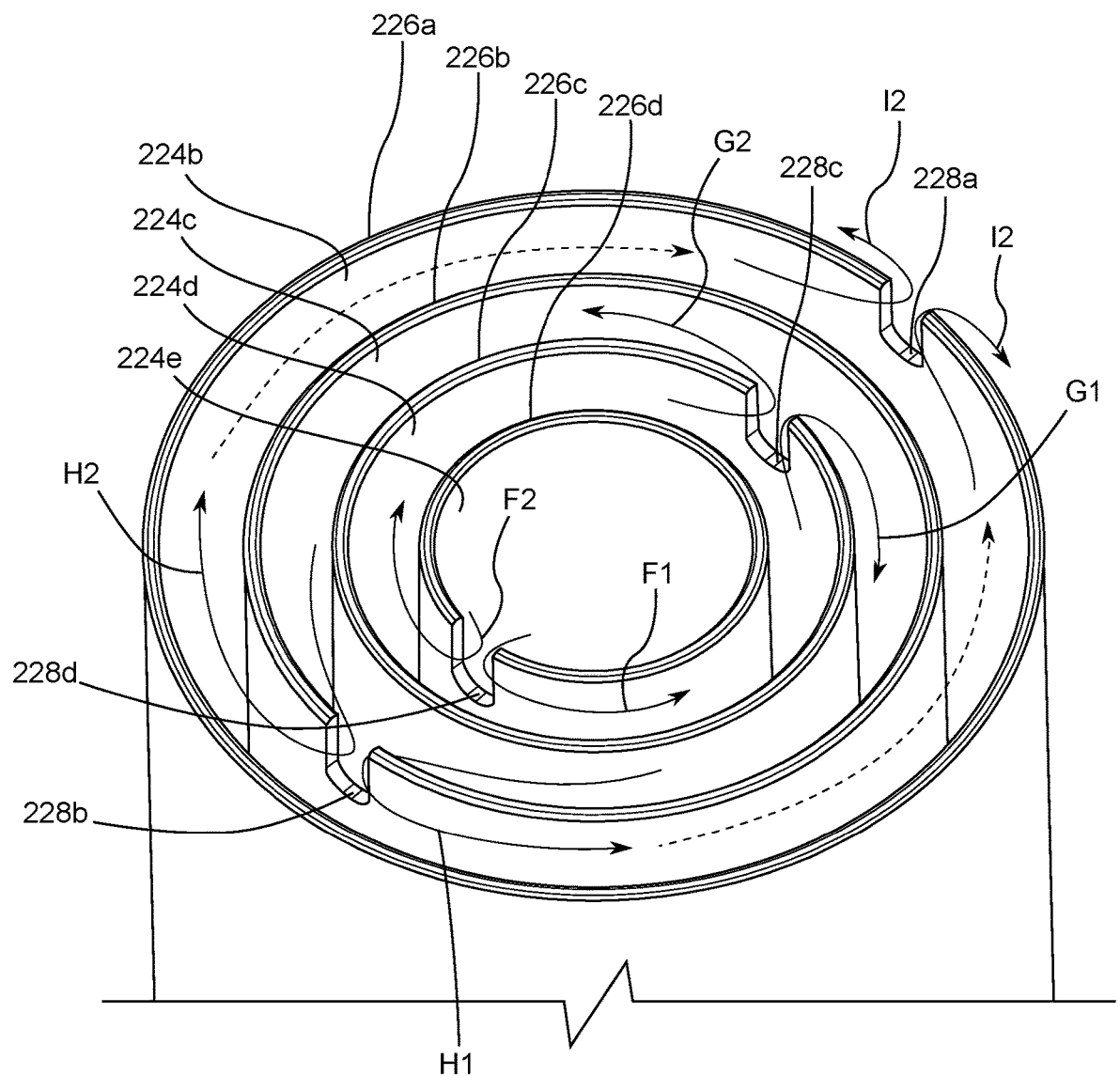
FIG. 7 shows a top perspective view of tubular walls of an ampoule according to FIGS. 1B and 6 with annotation of flow in accordance with one or more embodiments.

FIG. 7 shows a top perspective view of elongate walls 226a-226d of an ampoule with annotation of flow in accordance with one or more embodiments. In one or more embodiments, the elongate walls 226a-226d comprise elongate tubular walls, which define a series of flow channels 224a-224e. As depicted in FIG. 7, in one or more embodiments, the elongate walls 226a-226d are concentric and tubular. The relative location of the walls may be adjusted to, for example, favor depletion of the precursor in a desired matter. In one or more embodiments, annular distances between walls varies. The use of tubular elongate walls, fabricated by nesting readily available tubing facilitates assembly and reduces costs of the ampoules.

Carrier gas flow enters the ampoule 200 from the inlet port 220 by way of the inlet plenum 222, as discussed with respect to FIG. 6. The carrier gas enters the flow channel 224e defined by the elongate wall 226d and contacts the precursor thereby entraining and/or vaporizing the precursor as the carrier gas passes over a surface of a volume of the precursor. Flow then proceeds through ingress opening 228d of elongate wall 226d, at which point the carrier gas enters flow channel 224d and the surface of elongate wall 226c opposite the ingress opening 228d directs the flow in two directions, depicted by arrows F1 and F2 through the flow channel 224d. While in flow channel 224d, the carrier gas continues to contact the precursor and become saturated. Similarly, flow then proceeds through ingress opening 228c of elongate wall 226c, at which point the carrier gas enters flow channel 224c and the surface of elongate wall 226b directs the flow in two directions, depicted by arrows G1 and G2 through the flow channel 224c. While in flow channel 224c, the carrier gas continues to contact the precursor and become saturated. Likewise, flow then proceeds through ingress opening 228b of elongate wall 226b, at which point the carrier gas enters flow channel 224b and the surface of elongate wall 226a directs the flow in two directions, depicted by arrows H1 and H2 through the flow channel 224b. While in flow channel 224b, the carrier gas continues to contact the precursor and become saturated. Finally, flow then proceeds through ingress opening 228a of elongate wall 226a, at which point the carrier gas enters flow channel 224a defined by the sidewalls 214 (present in FIG. 6) and the elongate wall 226a, depicted by arrows I1 and I2 and out of the ampoule through outlet plenum 132 and outlet port 130. While in flow channel 224a, the carrier gas continues to contact the precursor and become saturated.

Accordingly, the flow channels 224a-224e are nested comprising a plurality of tortuous passages (224e, 224d, 224c, 224b) and an outlet passage (224a), such that with respect to the tortuous passages, flow through a first ingress opening (228d, 228c, 228b) diverts the carrier gas into first and second portions each flowing in first and second directions (e.g., F1 and F2, G1 and G2, and H1 and H2) through first and section sections of the tortuous passages, respectively.

Figure 8:
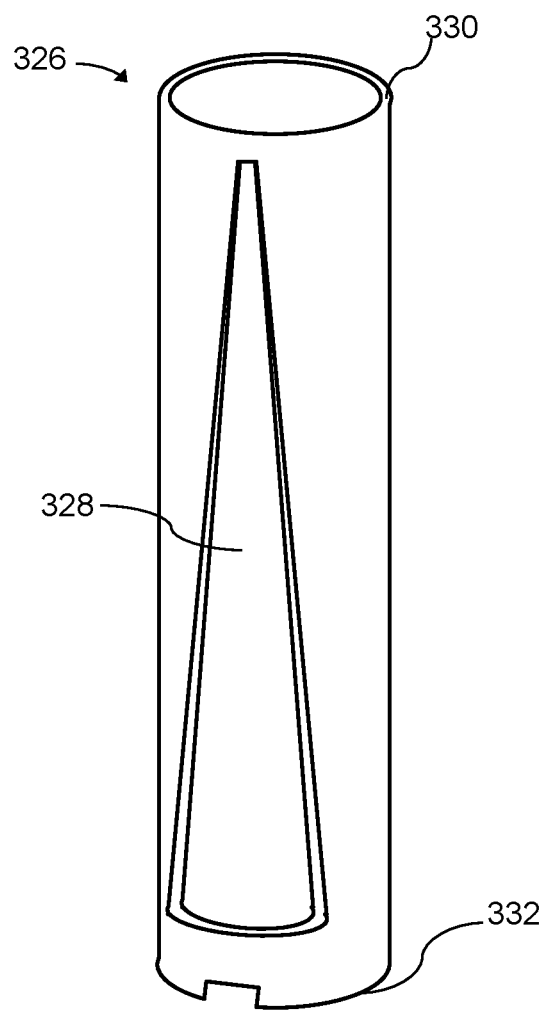
FIG. 8 shows a side perspective view of an exemplary tubular wall in accordance with one or more embodiments.

According to one or more embodiments, the ingress openings of any embodiment are suitable to allow carrier gas to flow from one flow channel to another. The ingress openings may take any suitable shape and/or configuration and/or location along the elongate walls to accommodate flow of entrained and/or saturated carrier gas. The ingress openings may span a full length of the container, or varying lengths. Features of the ingress openings could be a plurality of holes, tapered slots, or other shapes. In one or more embodiments, the ingress openings are sized and shaped to provide a varying conductance of carrier gas along a longitudinal distance of the container. In one or more embodiments, the ingress opening(s) increase in size in order to increase conductance from the lid toward the bottom wall of the ampoule. FIG. 8 illustrates a side perspective view of an exemplary tubular wall 326 comprising a wedge-shaped ingress opening 328 that progresses along a length of the elongate wall, increasing in size from a lid-end edge 330 to a bottom wall edge 332, which increases conductance from the lid toward the bottom wall of the ampoule.

In one or more embodiments, the ingress openings are notches located at a top end of the elongate walls near the lid. In one or more embodiments, each of the ingress openings spans a longitudinal distance of greater than or equal to 1-5% to less than or equal to 100% of a length of the wall, including all values and subranges therebetween.

In one or more embodiments, the ingress openings are a plurality of holes on each wall spaced apart along a length of each wall. In one or more embodiments, the plurality of holes spaced apart along a length of each wall increase in size from a lid-end edge to a bottom wall edge.

According to one or more embodiments, when the ampoule contains a minimum quantity of precursor, which may depend on the specific precursor in the ampoule and its physical properties, it is expected that the carrier gas will become fully saturated over the flow path distance. As the amount of precursor level in the ampoule decreases during service, the degree of saturation may decrease. Saturation may change as a function of fill level.

It is understood that the presence of five flow channels in FIGS. 2-3 is not limiting and that the number of channels may be chosen based on space constraints and/or precursor characteristics and/or design need.

In some embodiments, the gas flow through the inlet port 120 and along the flow path is sufficient to entrain and/or vaporize and/or sublime the precursor without a need for bubbling. The gas flow can be adjusted during processing as the level of precursor 150 decreases to maintain a sufficient contact. The gas flow of some embodiments has a maximum velocity in combination with the heat sources sufficient to prevent condensation of the precursor 150 at the outlet port 130.

Thermocouples, mass flow meters, and pressure gauges may be included in the equipment denoted herein in order to monitor process conditions. In one or more embodiments, a mass flow meter is provided to monitor gas flow into the inlet port. In one or more embodiments, a thermocouple is installed in the lid. In one or more embodiments, a pressure gauge is provided on the inlet line and/or the outlet line. A pressure range within the ampoule in accordance with some embodiments is greater than or equal to 25 torr to less than or equal to 150 torr.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. An ampoule for a semiconductor precursor, the ampoule comprising:
    a container defining a cavity and a longitudinal distance configured to hold the precursor;
    an inlet port and an outlet port, both in fluid communication with the cavity;
    an inlet plenum located between the inlet port and the cavity;
    an outlet plenum located between the outlet port and the cavity;
    a plurality of elongate walls having a length and comprising concentric tubes arranged to define flow channels, each of the elongate walls comprising an ingress opening; and
    a flow path defined by the flow channels and the ingress openings, through which a carrier gas flows in contact with the precursor, wherein each of the ingress openings progresses along the length of the elongate walls such that opening size increases from a lid-end edge to a bottom wall edge of the elongate walls to provide a varying conductance of the carrier gas along the longitudinal distance of the container.

2. The ampoule of claim 1, wherein the plurality of elongate walls and ingress openings define a labyrinth such that the flow path is tortuous.

3. The ampoule of claim 1, wherein the ingress openings are off-set such that not one ingress opening overlaps with another ingress opening.

4. The ampoule of claim 1, wherein the ampoule comprises a single inlet and a single outlet.

5. The ampoule of claim 1 comprising a distribution element located between the cavity and both the inlet and outlet plenums.

6. The ampoule of claim 1, wherein each of the ingress openings is wedge-shaped.

7. The ampoule of claim 1, wherein the plurality of elongate walls is effective to conduct heat from an external heat source.

8. The ampoule of claim 1, wherein the flow channels are nested, the flow channels comprising: a plurality of tortuous passages and an outlet passage, such that with respect to the tortuous passages, flow through a first ingress opening diverts the carrier gas into first and second portions each flowing in first and second directions through first and section sections of the tortuous passages, respectively.

9. An ampoule for dispensing a vapor mixture of a carrier gas and a low vapor pressure precursor used in semiconductor manufacturing, the ampoule comprising:
    a container having a bottom wall, sidewalls defining a longitudinal distance, and a lid, the container defining a cavity configured to hold the precursor, such that a height (H) of the cavity spans from a lower surface of the lid to a top surface of the bottom wall;
    a single inlet port and a single outlet port, both in fluid communication with the cavity;
    an inlet plenum located between the inlet port and the cavity;
    an outlet plenum located between the outlet port and the cavity;
    a plurality of elongate tubular, concentric walls having a length arranged to define flow channels, each of the elongate tubular, concentric walls comprising an ingress opening, the ingress openings being off-set such that not one ingress opening overlaps with another ingress opening; and
    a tortuous flow path defined by the flow channels and the ingress openings, through which a carrier gas flows in contact with the precursor, wherein each of the ingress openings progresses along the length of the plurality of elongate tubular, concentric walls such that opening size increases from a lid-end edge to a bottom wall edge of the elongate tubular, concentric walls to provide a varying conductance of the carrier gas along the longitudinal distance of the container.

10. The ampoule of claim 9 comprising a distribution element located between the cavity and both the inlet and outlet plenums, and spanning at least a distance of an inner diameter defined by the sidewalls.

11. The ampoule of claim 9, wherein each of the ingress openings is wedge-shaped.

12. The ampoule of claim 9, wherein the bottom wall comprises a plurality of grooves that mate with the plurality of elongate tubular walls.

13. The ampoule of claim 9, wherein a length of the flow path is effective for saturation of the carrier gas by the precursor.

14. The ampoule of claim 9, wherein the plurality of elongate walls is effective to conduct heat from an external heat source.

15. The ampoule of claim 9, wherein the flow channels are nested, the flow channels comprising: a plurality of tortuous passages and an outlet passage, such that with respect to the tortuous passages, flow through a first ingress opening diverts the carrier gas into first and second portions each flowing in first and second directions through first and section sections of the tortuous passages, respectively.

16. A method of providing a flow of precursor, the method comprising:

flowing a carrier gas through an inlet port and an inlet plenum of an ampoule having a low vapor pressure precursor therein;

directing the flow of the carrier gas within the ampoule and in contact with the precursor through a flow path defined by a plurality of elongate concentric walls having a length and defining a longitudinal distance and ingress openings in each of the elongate walls, through which a carrier gas flows in contact with the precursor; and flowing the carrier gas and precursor out of the ampoule through an outlet plenum and an outlet port, wherein each of the ingress openings progresses along the length of the plurality of elongate concentric walls such that opening size increases from a lid-end edge to a bottom wall edge of the elongate concentric walls to provide a varying conductance of the carrier gas along the longitudinal distance of the plurality of concentric walls.

17. The method of claim 16, wherein a length of the flow path is effective for saturation of the carrier gas by the precursor.

18. The method of claim 16 further comprising independently heating a lid and a bottom wall of the ampoule, the plurality of elongate walls being effective to conduct heat from an external heat source.

19. The method of claim 16, wherein the flow path comprises nested passages such that flow through a first ingress opening diverts the carrier gas into first and second portions each flowing in first and second directions through first and second sections of each of the passages, respectively.

* * * * *

UNITED STATES PATENT AND TRADEMARK OFFICE
CERTIFICATE OF CORRECTION

PATENT NO. : 11,578,406 B2
APPLICATION NO. : 17/114798
DATED : February 14, 2023
INVENTOR(S) : Carl White et al.

Page 1 of 1

It is certified that error appears in the above-identified patent and that said Letters Patent is hereby corrected as shown below:

In the Specification

•Column 7, Line 42, replace "section" after "and" and before "sections" with "second".

•Column 10, Line 27, replace "section" after "and" and before "sections" with "second".

In the Claims

•Column 12, Claim 8, Line 26, replace "section" before "sections" with "second".

•Column 13, Claim 15, Line 10, replace "section" before "sections" with "second".

Signed and Sealed this
Twenty-eighth Day of March, 2023

Katherine Kelly Vidal
*Director of the United States Patent and Trademark Office*